United States Patent [19]

Beyer et al.

[11] Patent Number: 5,046,155
[45] Date of Patent: Sep. 3, 1991

[54] HIGHLY DIRECTIVE, BROADBAND, BIDIRECTIONAL DISTRIBUTED AMPLIFIER

[75] Inventors: James B. Beyer, Madison; Joseph W. Byrne, Waukesha, both of Wis.

[73] Assignee: Wisconsin Alumni Research Foundation, Madison, Wis.

[21] Appl. No.: 505,377

[22] Filed: Apr. 6, 1990

[51] Int. Cl.[5] ............................................. H03F 3/60
[52] U.S. Cl. ........................................ 330/54; 330/277
[58] Field of Search ................... 330/53, 54, 277, 286

[56] References Cited

U.S. PATENT DOCUMENTS

| | | | |
|---|---|---|---|
| 4,291,286 | 9/1981 | Wagner | 330/54 X |
| 4,486,719 | 12/1984 | Ayasli | 330/286 |
| 4,543,535 | 9/1985 | Ayasli | 330/53 |
| 4,595,881 | 6/1986 | Kennan | 330/54 |

OTHER PUBLICATIONS

J. Beyer, et al., "MESFET Distributed Amplifier Design Guidelines," IEEE Trans. on Microwave Theory and Techniques, vol. MIT-32, No. 4, Mar. 1984, pp. 268-275.

O. P. Leisten, et al., "Distributed Amplifiers as Duplexer/Low Crosstalk Bidirectional Elements in S-Band," Electronics, vol. 24, No. 5, Mar. 3, 1988, pp. 264-265.

Primary Examiner—James B. Mullins
Attorney, Agent, or Firm—Foley & Lardner

[57] ABSTRACT

A highly directive, broadband, bidirectional distributed amplifier has a series of FETs connected between input and output lines which have their effective transconductances scaled in accordance with binomial coefficients along the distributed amplifier to maximize the directivity of the amplifier. Directivities on the order of $-25$ to $-35$ dB are obtained over as much as an octave in frequency. The effective binomial scaling may be achieved by insertion of appropriately sized capacitors in the gate lines of each of the FETs. The minimization bandwidth may be shifted to lower frequencies by incorporating passive impedances between the active devices in both the gate and drain lines. These impedances preferably comprise T-section inserts composed of serially connected lumped inductors and a capacitance from the junction between the inductors to ground. The distributed amplifier is bidirectional so that it can be excited from either port on the gate line with high directivity exhibited at each respective port on the drain line.

8 Claims, 7 Drawing Sheets

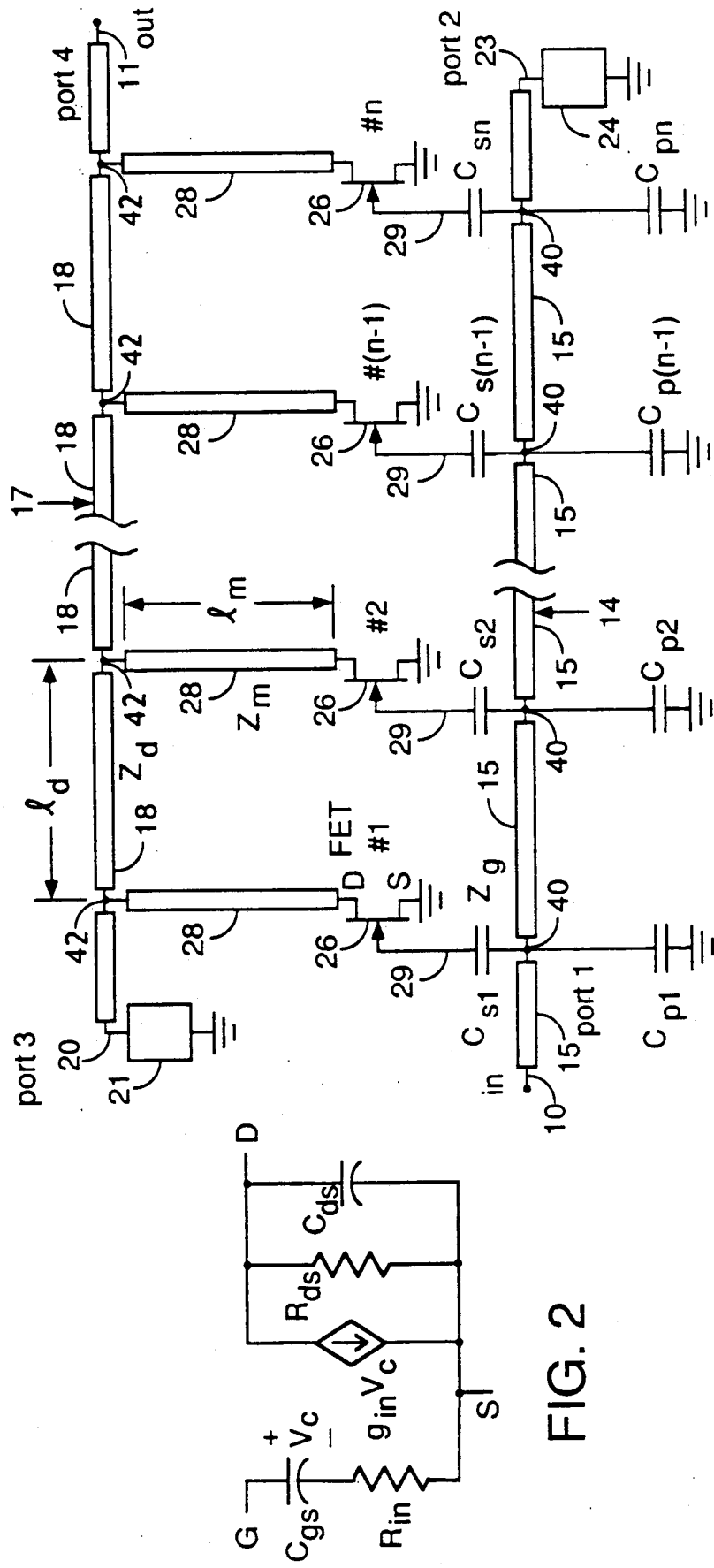

HIGHLY DIRECTIVE, BROADBAND, BIDIRECTIONAL DISTRIBUTED AMPLIFIER

FIELD OF THE INVENTION

This invention pertains generally to the field of electronic amplifiers, particularly of the type adapted for use at microwave frequencies, and more specifically to distributed amplifiers.

BACKGROUND OF THE INVENTION

A typical conventional microwave distributed amplifier circuit consists of periodically spaced field-effect transistors (FETs) which are connected by electrically short, high impedance microstrip lines. The design of such conventional amplifiers is generally discussed in, for example, the article by J. B. Beyer, et al., "MESFET Distributed Amplifier Design Guidelines," IEEE Trans. Microwave Theory Tech, Vol. MTT-32, March 1984, pp. 268-275, which is incorporated herein by reference. A distributed amplifier may be qualitatively described as a set of artificial input and output transmission lines which are coupled by (FET) transconductances.

A schematic view of a typical conventional distributed amplifier having an arbitrary number of sections "n" is shown in FIG. 1. The amplifier has an input port 10, an output port 11, an input line 14 consisting of a series of high impedance microstrip artificial transmission line elements 15, an output line 17 composed of a series of high impedance microstrip artificial transmission line elements 18, an image matching port 20 on the output line having an image matching impedance and DC drain bias source 21 connected to ground, an image matching port 23 on the input line having an image matching impedance and DC gate bias source 24 connected to ground, and a series of field effect transistors (FETs) 26 connected in a common-source configuration. The drains of each FET are connected by microstrip lines 28 to junction nodes between the microstrips 18 of the output line, and the gates are connected by connecting lines 29 to junction nodes between the input line microstrips 15. The terminations 21 and 24 are standard and well known in the art, and various gate and drain biases may be used. See, e.g., the biasing and termination circuits shown in U.S. Pat. Nos. 4,486,719, 4,543,535 and 4,595,881. The conventional distributed amplifier of FIG. 1 and the present invention are illustrated utilizing microstrip transmission lines although, of course, lumped inductance and capacitance transmission lines may also be used.

Due to the symmetry of distributed amplifier circuits, such as the one shown in FIG. 1, half of the current from each active device (e.g., FET) propagates in the forward direction (toward port 4) and half in the reverse direction (toward port 3). Unlike the "in phase" currents travelling in the forward direction, those travelling in the reverse direction are "out of phase" with each other and thus destructively interfere to some extent. Because of this cancellation, the conventional distributed amplifier is inherently a directional circuit. The directional properties of a conventional distributed amplifier have been compared to that of an ideal circulator. 0. P. Leisten, et al., "Distributed Amplifiers As Duplexer-Low Crosstalk Bidirectional Elements In S-Band," Electronics Letters Vol. 24, No. 5, Mar. 3, 1988, pp. 264-265.

Directivity (D) for the distributed amplifier can be defined as the ratio of the reverse output power ($P_{out}^-$) at port 3 to the forward power output ($P_{out}^+$) at port 4. In dB this is given as:

$$D = -10 \log (P_{out}^-/P_{out}^+) = -20 \log (|S_{31}/S_{41}|)$$

The conventional distributed amplifier is typically found to have a directivity of between $-10$ to $-20$ dB over most of the frequency range of interest.

SUMMARY OF THE INVENTION

A distributed amplifier in accordance with the present invention is a highly directive broadband bidirectional distributed amplifier having directivities on the order of $-25$ to $-35$ dB over as much as an octave in frequency. The increase in directivity is obtained in the present invention by minimization of the four port S-parameter $S_{31}$ by binomially scaling the effective transconductances of the FETs in the amplifier, resulting in a broadening of the bandwidth as well as an increase in directivity. Appropriate sized capacitors may be inserted in the gate line of each FET to yield the effective binomial scaling.

The minimization bandwidth is shifted in the present invention to lower frequencies by incorporating passive impedances between the active devices in both the gate and drain lines. The passive impedances preferably comprise T-section inserts composed of serially connected lumped inductors and a capacitance from the junction between the inductors to ground. In this manner, exemplary directivities on the order of $-30$ dB can be obtained over a selected frequency range of interest. Very little insertion loss is encountered by utilizing the passive impedance sections. Because the distributed amplifier is bidirectional, it can be excited either from port 1 or port 2 with the same high directivity obtained at the respective output port on the drain line. Thus, it may be driven from both ends of the gate lines simultaneously, provided the amplitudes are such that the active device linear range is not exceeded, with high directivity exhibited at each respective port on the drain line.

Further objects, features, and advantages of the invention will be apparent from the following detailed description when taken in conjunction with the accompanying drawings.

BRIEF DESCRIPTION OF THE DRAWINGS

In the drawings:

FIG. 2 is a small signal equivalent FET circuit model in which device losses are included.

FIG. 3 is a schematic circuit diagram of an n-section distributed amplifier in accordance with the invention in which gate capacitors are incorporated to provide binomial scaling.

DETAILED DESCRIPTION OF THE INVENTION

From directional coupler theory, a minimized and maximally flat (broadband) characteristic for $S_{31}$ will be obtained about a center frequency $\omega = \omega_o$ if $S_{31}$ and its first N−1 derivatives with respect to frequency are identically zero at $\omega = \omega_o$. One such function which exhibits this behavior is $$f(\beta) = A(1 + e^{-j2\beta})^N = A \sum_{i=0}^{N} c_i^N e^{-j2i\beta}$$

where A is a constant and the coefficients $c_i^N$ are binomial coefficients given by $$c_i^N = \frac{N!}{(N-i)!i!} \quad i = 0, 1, 2, 3 \ldots, N$$

The significance of the above equation for $f(\beta)$ is that the expression for $S_{31}$ for the conventional distributed amplifier is similar in form.

In the case of the ideal distributed amplifier, one can assume no losses and model each device using typical capacitance values for a 400 μm FET. It is assumed that the transconductances of the FETs may differ from one another. For such a circuit, $S_{31}$ and $S_{41}$ are given as $$s_{31} = -1/2 \, Z_{image} \left[ \sum_{i=1}^{n} g_{mi} e^{-j2(i-1)\beta} \right]$$

$$s_{41} = -1/2 \, Z_{image} \, e^{-j(n-1)\beta} \left[ \sum_{i=1}^{n} g_{mi} \right]$$

where $\beta$ is the phase shift per $\pi$-section along the lines and n represents the number of devices in the amplifier. Comparing the expressions for $f(\beta)$ and $S_{31}$, it can be seen that they are essentially the same expression if $A = -\frac{1}{2} Z_{image}$ and $C_i^N = g_{mi}$. Therefore, by binomially scaling the FET transconductances, a minimized maximally flat signal at port 3 should be obtained, thus improving the directivity.

FIG. 2 shows a realistic FET small signal model in which device losses have been included. Each port is assumed to be terminated with m-derived impedance transforming sections. These sections match the lines image impedance to conventional 50 ohm systems. Typical values for the equivalent circuit elements are $C_{gs}=0.5$ pF, $C_{ds}=0.09$ pF, $R_{ds}=375$ ohms, $R_i=7.5$ ohms, $g_m=0.04$ mhos.

In the present invention, a series capacitor ($C_s$) is incorporated in the gate lead of each device as shown in FIG. 3. The voltage divider established between $C_{gs}$ and $C_s$ yields an effective transconductance $g_{mi}'$ at the ith device given by $$g_{mi}' = g_{mi} \frac{C_{si}}{(C_{si} + C_{gs})}$$

where $C_{si}$ is the value of the capacitance of the series capacitor at the ith device. Thus, by selection of the values $C_{si}$ of the individual series capacitors, the desired binomial scaling of $g_{mi}'$ in proportion to $C_i^N$ can be achieved. A padding capacitor ($C_p$) is also preferably added at each gate to keep the total shunt capacitance at each node along the gate line constant.

Figure 1:
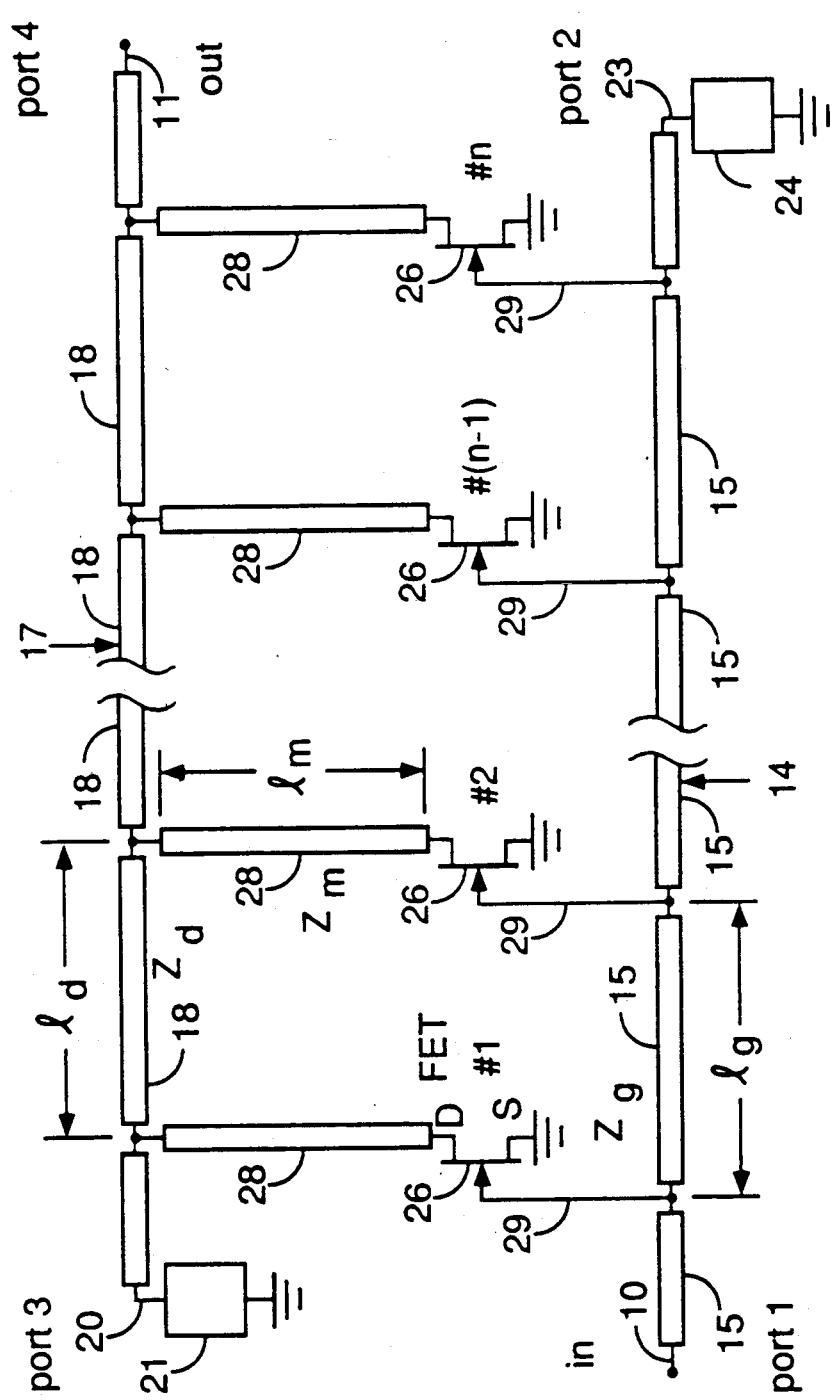
FIG. 1 is a schematic circuit diagram of a conventional (prior art) n-section distributed amplifier.
Figure 4:
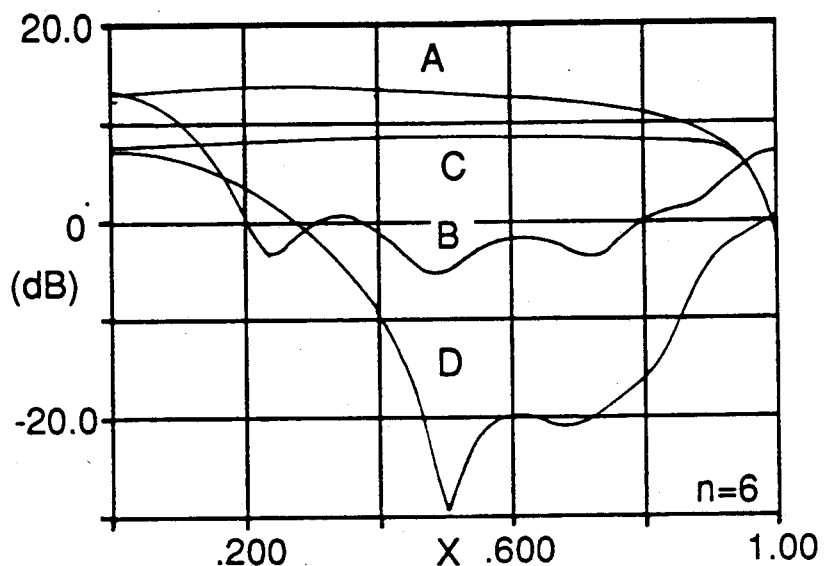
FIG. 4 is a plot of $S_{31}$ for uniform scaling (B) and binomial scaling (D), and $S_{41}$ for uniform scaling (A) and binomial scaling (C) for the distributed amplifier with losses and m-derived terminations.
Figure 5:
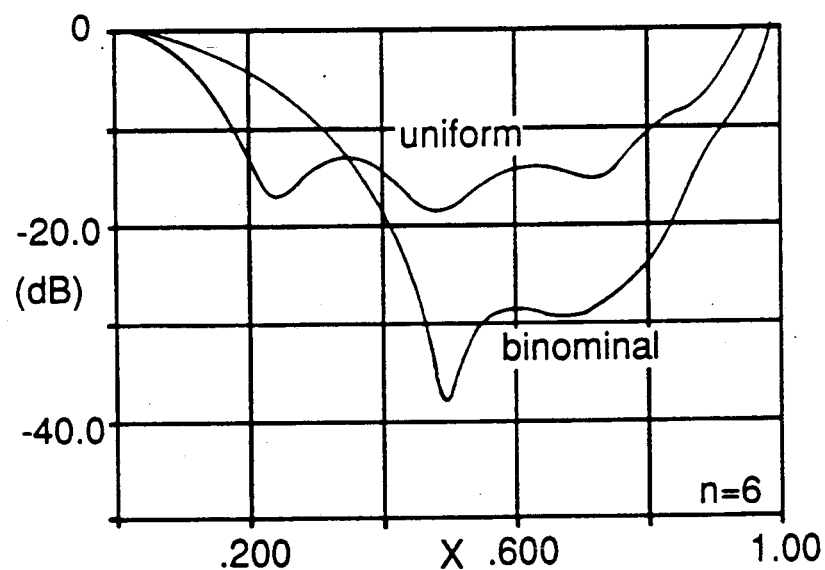
FIG. 5 are plots of directivity for distributed amplifiers with losses and m-derived terminations which have uniform scaling and binomial scaling.

As an alternative to the additional series capacitors of capacitance $C_{si}$, the gate width of the devices could be scaled to yield the desired $g_{mi}'$. It can easily be shown that approximate expressions for $S_{31}$ and $S_{41}$ in a practical device are very similar in form to those given above for the ideal circuit. Therefore binomial scaling can be used to increase the directivity of the practical amplifier. The results for $S_{31}$ and $S_{41}$ are shown in FIG. 4 where both the uniform (curves A and B) and binomial (curves C and D) cases are compared. As shown in FIG. 5, the directivity is improved from between −10 to −20 dB in the uniform case to between −25 and −35 dB in the binomial case.

The minimization of $S_{31}$ is inherently centered about a frequency $\omega = \omega_o$ at which the phase shift per x-section is $\beta = \beta_o = 90°$. This frequency is fixed at $X_c = 0.707$ and thus a large portion of the minimization bandwidth falls above 0.707 $\omega_c$. Unfortunately, this is also the frequency above which the magnitude of $S_{41}$ begins to roll off quite rapidly. For this reason, and also for added flexibility, it would be desirable to shift the minimization bandwidth to lower frequencies.

Figure 6:
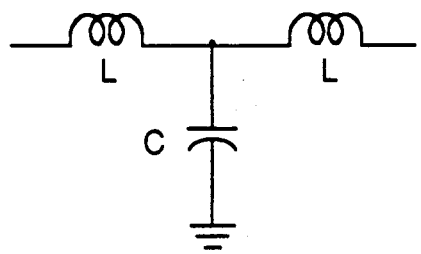
FIG. 6 is a schematic circuit diagram of a T-section insert which can be used to shift the minimization bandwidth of the distributed amplifier.
Figure 7:
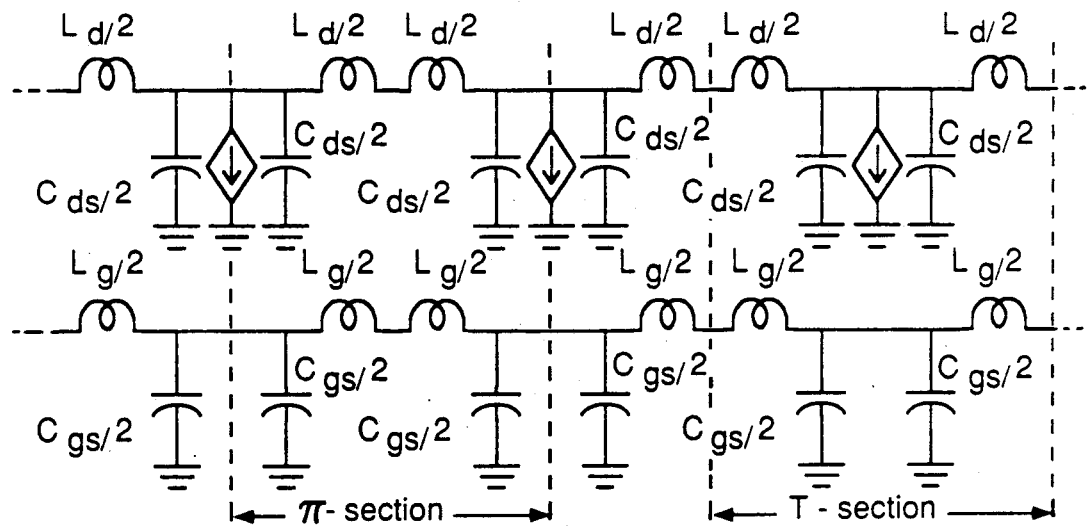
FIG. 7 is an equivalent circuit of a conventional distributed amplifier illustrating the equivalent $\pi$-sections and T-sections.
Figure 8:
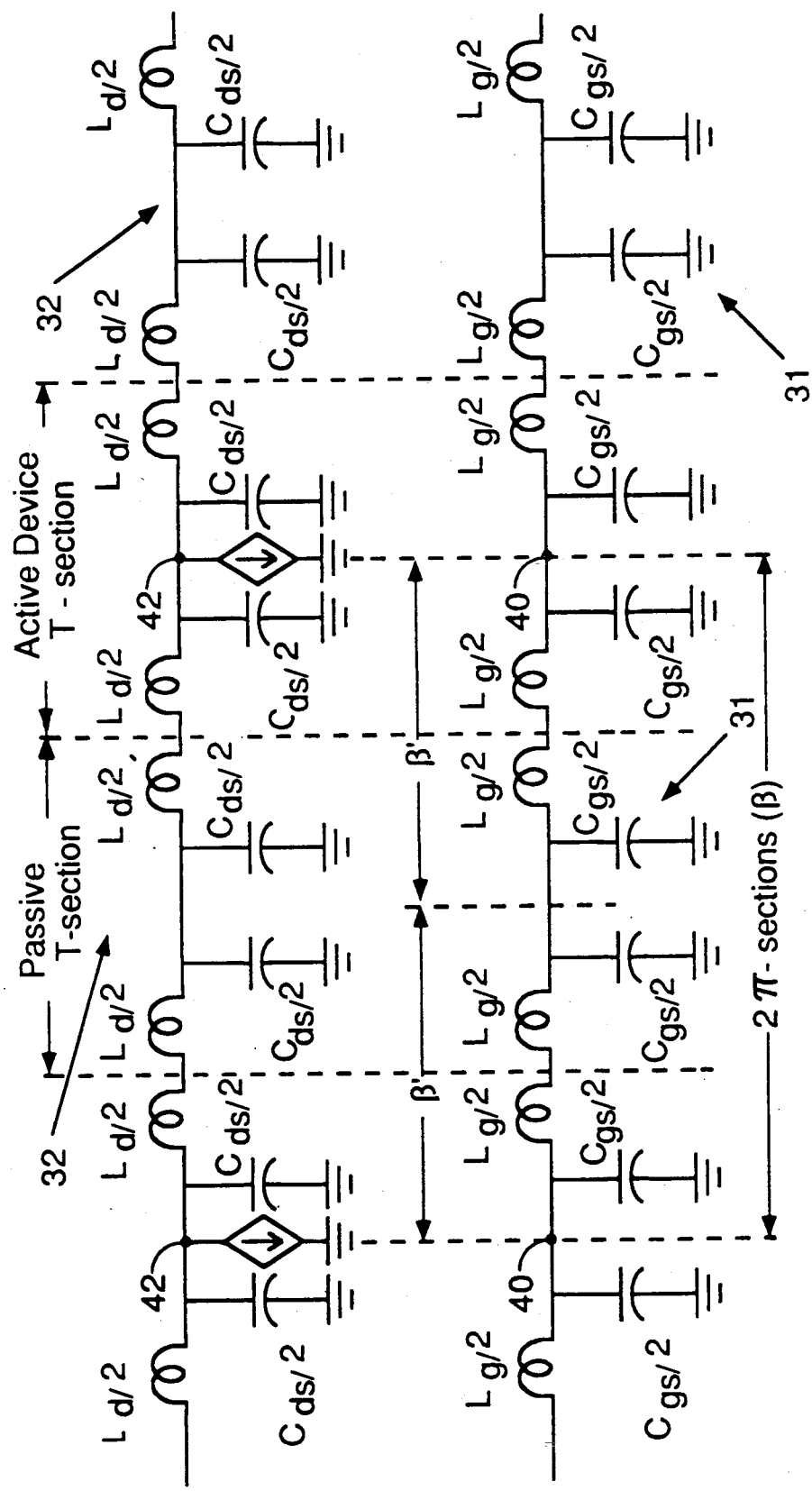
FIG. 8 is an equivalent circuit of a distributed amplifier in accordance with the invention employing passive impedance T-inserts for shifting the minimization bandwidth to lower frequencies.
Figure 9:
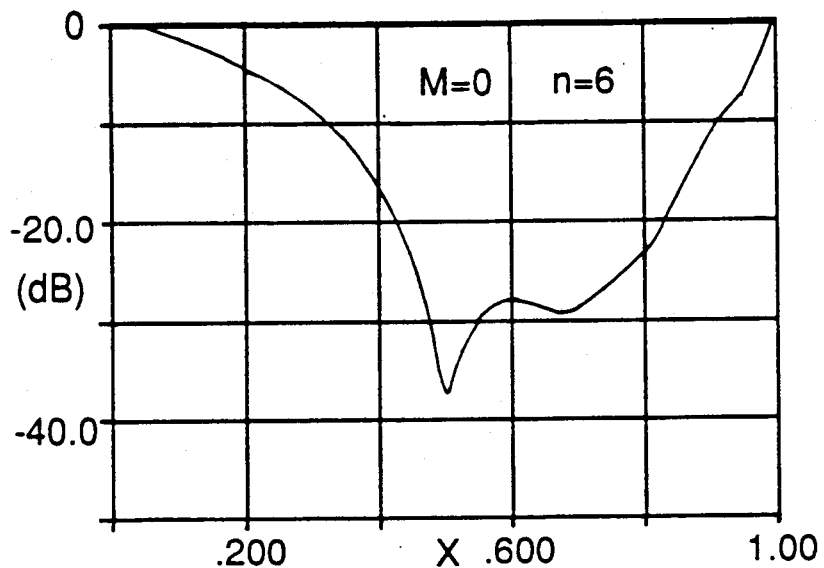
FIG. 9 is a plot of directivity for the binomially scaled distributed amplifier with losses and m-derived terminations for which M=0 (no T-section inserts).
Figure 10:
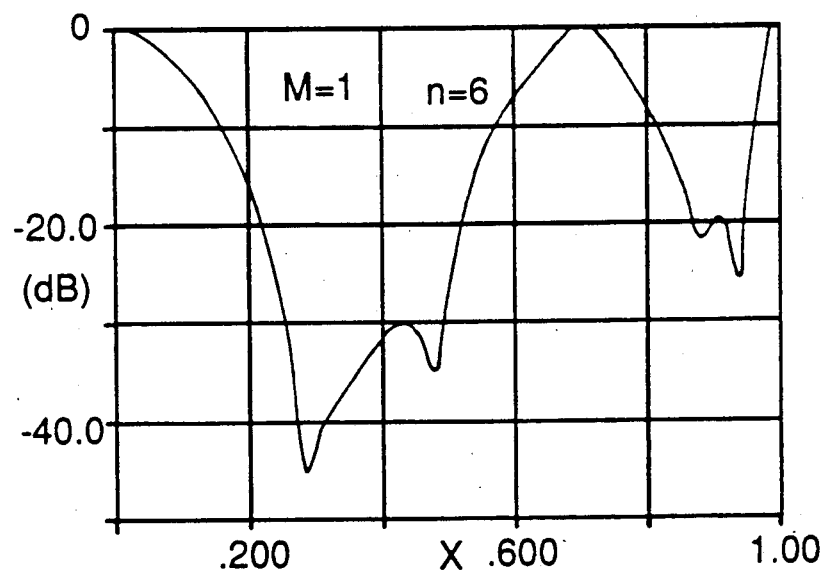
FIG. 10 is a plot of directivity for the binomially scaled distributed amplifier with losses and m-derived terminations for which M−1 (one T-section insert).

This can be done by inserting the passive T-section of FIG. 6 between devices in both the gate and drain lines between the nodes 40 on the gate (or input) line and between the nodes 42 on the drain (or output) line. FIG. 7 is an equivalent circuit for a section of a conventional distributed amplifier illustrating the equivalent $\pi$-sections and T-sections. FIG. 8 shows the equivalent circuit for the amplifier of FIG. 7 modified to incorporate passive impedance sections denoted at 31 for the gate line, impedances and 32 for the drain line impedances, with the passive impedance sections 31 being connected between the nodes 40 on the gate (or input) line and the passive impedance sections 32 being connected between the nodes 42 on the drain (or output) line. To illustrate the symmetry, the T-section capacitors are shown as split into two capacitors, each of value $C_{gs/2}$ or $C_{ds/2}$, it being understood that a single capacitor would be utilized. The insertion of the T-sections lowers the minimization bandwidth center frequency $\beta_0$ to a frequency at which $\omega_o = 90°/(M+1)$ where M is the number of T-sections inserted between devices. FIG. 9 is a plot of directivity for an amplifier (such as shown in FIG. 7) without T-sections, which has binomial scaling, losses and m-derived terminations. FIG. 10 is a plot of directivity for an amplifier (such as shown in FIG. 8) with one T-section insert (M=1), which has binomial scaling, losses and m-derived terminations. The desired shift in the minimization bandwidth to lower frequencies is apparent from these plots.

To obtain even more meaningful results, the FET small signal equivalent circuit of FIG. 2 was replaced with the actual measured s-parameter data of an NEC 9000 transistor obtained using a Hewlett-Packard 8510 network analyzer. The circuit, utilizing lumped elements between devices, was optimized, with the results shown in FIGS. 11 and 12 for binomially scaled distributed amplifiers without and with T-section inserts, respectively.

Figure 11:
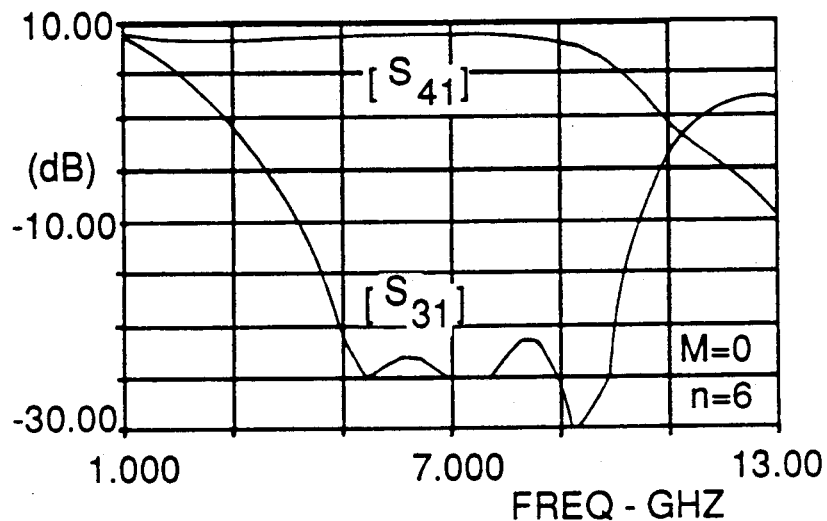
FIG. 11 are plots of $S_{31}$ and $S_{41}$ for the binomially scaled distributed amplifier, utilizing measured S-parameter data for the NEC 9000 transistor with no T-section inserts.
Figure 12:
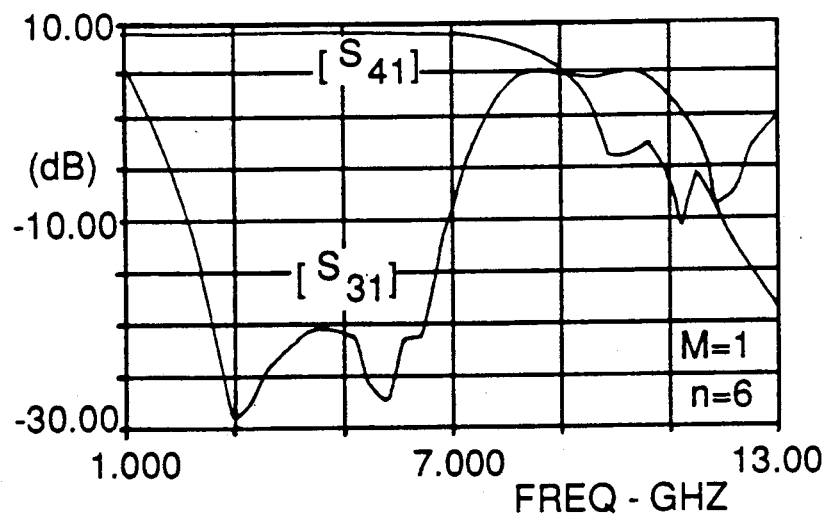
FIG. 12 are plots of $S_{31}$ and $S_{41}$ for the binomially scaled distributed amplifier, utilizing measured S-parameter data for the NEC 9000 transistor with one T-section insert.

FIG. 11 shows directivities on the order of $-30$ dB over as much as an octave in frequency (5 GHz–10 GHz). FIG. 12 illustrates results obtained for the same circuit utilizing the T-section inserts. The minimization bandwidth has clearly been shifted to lower frequencies, with directivities on the order of $-30$ dB obtained over the frequency range from 2.5 GHz to 6.5 GHz. For both circuits, the input and output insertion losses were better than $-15$ dB over the frequency range of interest. These circuits are bidirectional and can be excited from either port 1 or port 2 with the same high directivity obtained at the respective output ports on the drain line.

It is thus seen that the present invention increases the directivity of the conventional distributed amplifier. Through effective binomial scaling of the individual device transconductances, directivities on the order of $-25$ to $-35$ dB have been exhibited using computer simulation and measured s-parameter data for the NEC 9000 transistor. The circuit is broadband with the potential for operation over an octave or more in frequency. Finally, the circuit is bidirectional in that it may be driven from both ends of the gate line simultaneously with high directivity exhibited at each respective port on the drain line.

Although the distributed amplifier of the invention has been described herein with respect to an exemplary structure utilizing FETs as the amplifying elements, other amplifying elements such as bipolar transistors and certain types of superconducting transistors may also be utilized, as well as, of course, tube amplifiers. For amplifying elements which have transresistance gain, the transresistance of the elements in the distributed amplifier may be scaled in the manner described above. For general reference to either type of device, the gain of the amplifying element may be considered to be binomially scaled as set forth herein.

It is understood that the invention is not limited to the particular embodiments disclosed herein, but embraces such modified forms thereof as come within the scope of the following claims.

What is claimed is:

1. A highly directive distributed amplifier comprising:
   (a) an input line comprised of a series of artificial transmission line elements connected together at nodes;
   (b) an output line comprised of a series of artificial transmission line elements connected together at nodes;
   (c) a plurality of FETs connected in a common source configuration between the nodes on the input and output lines;
   (d) means for binomially scaling the effective transconductances of the FETs so that the effective transconductance of the ith FET is proportional to a coefficient $c_i^N$ determined in accordance with the expression $$c_i^N = \frac{N!}{(N-i)!i!}$$

where N is the total number of FETs.

2. The distributed amplifier of claim 1 wherein the means for binomially scaling the effective transconductances of the FETs comprise a scaling capacitor connected in series in a gate line for each FET between the node on the input line and the gate of the FET, the values of each scaling capacitor selected such that the effective transconductance of the ith FET is given by the expression $$g_{mi}' = g_{mi} \frac{C_{si}}{(C_{si} + C_{gs})}$$

where $C_{gs}$ is the gate-to-source capacitance of the FET, $g_{mi}$ is the transconductance of the ith FET, and $C_{si}$ is the value of the scaling capacitor selected such that $g'_{mi}$ follows binomial scaling along the FETs of the distributed amplifier.

3. The distributed amplifier of claim 2 further including padding capacitors connected to the nodes of the input line at selected values such that the capacitance at the nodes along the gate line is substantially constant.

4. The distributed amplifier of claim 3 further comprising passive T-section impedances connected between the nodes in both the input and output line in addition to the artificial transmission line elements, each T-section comprising series connected lumped inductances and a capacitance connected between the node joining the inductances to ground.

5. The distributed amplifier of claim 2 further comprising passive T-section impedance connected between the nodes in both the input and output line in addition to the artificial transmission line elements, each T-section comprising series connected lumped inductances and a capacitance connected between the node joining the inductances and ground.

6. The distributed amplifier of claim 1 further including passive T-section impedances connected between the nodes in both the input and output line in addition to the artificial transmission line elements, each T-section comprising series connected lumped inductances and a capacitance connected between the node joining the inductances and ground.

7. A highly directive distributed amplifier comprising:
   (a) an input line comprised of a series of artificial transmission line elements connected together at nodes;
   (b) an output line comprised of a series of artificial transmission line elements connected together at nodes;
   (c) a plurality of amplifying elements connected between the nodes on the input and output lines to provide an amplified signal from the input line to the output line;
   (d) means for binomially scaling the effective gains of the amplifying elements so that the effective gain of the ith element is proportional to a coefficient $C_i^N$ determined in accordance with the expression $$C_i^N = \frac{N!}{(N-i)!i!}$$

where N is the total number of amplifying elements.

8. The distributed amplifier of claim 7 further including passive T-section impedance connected between the nodes in both the input and output line in addition to the artificial transmission line elements, each T-section comprising series connected lumped inductances and a capacitance connected between the node joining the inductances and ground.

* * * * *